(12) United States Patent
Iizuka

(10) Patent No.: US 8,043,471 B2
(45) Date of Patent: Oct. 25, 2011

(54) PLASMA PROCESSING APPARATUS

(75) Inventor: Hachishiro Iizuka, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1082 days.

(21) Appl. No.: 11/694,027

(22) Filed: Mar. 30, 2007

(65) Prior Publication Data

US 2007/0227668 A1 Oct. 4, 2007

Related U.S. Application Data

(60) Provisional application No. 60/791,224, filed on Apr. 12, 2006.

(30) Foreign Application Priority Data

Mar. 31, 2006 (JP) ................................. 2006-099655

(51) Int. Cl.
  *C23C 16/00* (2006.01)
  *H01L 21/306* (2006.01)
(52) U.S. Cl. ............ 156/345.48; 204/298.06; 118/723 I
(58) Field of Classification Search ................. 118/723 I, 118/723 IR, 723 AN; 156/345.48, 345.49; 315/111.51; 204/298.06, 298.08, 298.12, 204/298.13

See application file for complete search history.

(56) References Cited

U.S. PATENT DOCUMENTS

| | | | | |
|---|---|---|---|---|
| 4,411,763 A | * | 10/1983 | Itaba et al. | ............... 204/298.06 |
| 4,492,620 A | * | 1/1985 | Matsuo et al. | ........... 204/192.12 |
| 5,556,501 A | * | 9/1996 | Collins et al. | ............ 156/345.38 |
| 5,571,366 A | * | 11/1996 | Ishii et al. | ................ 156/345.26 |
| 5,710,486 A | * | 1/1998 | Ye et al. | .................... 315/111.21 |
| 6,217,730 B1 | * | 4/2001 | Nakajima et al. | ........ 204/298.11 |
| 6,280,563 B1 | * | 8/2001 | Baldwin et al. | .......... 156/345.48 |
| 6,565,717 B1 | * | 5/2003 | Leet et al. | ................ 204/192.12 |

FOREIGN PATENT DOCUMENTS

| | | |
|---|---|---|
| JP | 04-350161 | 12/1992 |
| JP | 11-200042 | 7/1999 |
| JP | 2002-500413 | 1/2002 |
| JP | 2003-229379 | 8/2003 |
| JP | 2005-023400 | 1/2005 |

OTHER PUBLICATIONS

Japanese Office Action (with English Translation) issued May 24, 2011 in Japanese Application No. 2006-099655 filed Mar. 31, 2006, 7 pages.

* cited by examiner

*Primary Examiner* — Luz L. Alejandro

(74) *Attorney, Agent, or Firm* — Oblon, Spivak, McClelland, Maier & Neustadt, L.L.P.

(57) ABSTRACT

A plasma processing apparatus includes a processing chamber; a plasma generating unit for generating a plasma of a gas supplied into the processing chamber; a substrate mounting table, disposed in the processing chamber, for mounting a semiconductor substrate having a surface on which an etching and/or a film forming process is to be performed. The apparatus further includes a metal member disposed in the processing chamber and to be etched by the plasma generated in the processing chamber to release a precursor of a film to be formed by the film forming process into the processing chamber; a gas supply unit for supplying a first and a second gas into the processing chamber, wherein the second gas which includes halogen atoms and is different from the first gas; a first and a second wiring for supplying high frequency power to the metal member and the substrate mounting table, respectively.

24 Claims, 9 Drawing Sheets

PLASMA PROCESSING APPARATUS

FIELD OF THE INVENTION

The present invention relates to a plasma processing apparatus for processing a semiconductor substrate, by using plasma.

BACKGROUND OF THE INVENTION

A plasma processing apparatus is used in manufacturing semiconductor devices. The plasma processing apparatus performs an etching process, a chemical vapor deposition (CVD) process, and the like on a semiconductor wafer, by using plasma. The plasma processing apparatus generates the plasma in a processing chamber while a semiconductor wafer is mounted on a substrate mounting table disposed in the processing chamber. Then, a predetermined plasma process is performed on a surface of the wafer by the plasma.

Depending on plasma sources for generating the plasma, plasma processing methods or apparatuses are classified as capacitively coupled plasma (CCP), electron cyclotron resonance plasma (ECRP), helicon wave plasma (HWP), inductively coupled plasma (ICP), and microwave excitation surface wave plasma (SWP). In the plasma sources except for the CCP, a discharge power and a bias power are independently controllable. Therefore, these plasma sources are used to make the control of an etching shape and the like easy.

In a semiconductor manufacturing process, a plasma processing apparatus is employed as an apparatus included in, for example, a metal film forming system. Patent References 1 and 2 disclose a metal film forming system 100 in which a plasma processing apparatus is included as a pre-cleaning device 115 for a semiconductor wafer, as illustrated in FIG. 9. The metal film forming system 100 includes a transfer chamber 110, a transfer arm 119, and a group of devices 111, 112, 113, 114, 115, 116, 117 and 118 disposed around the transfer chamber 110. The group of devices includes cassette chambers 111 and 112, a degassing chamber 113, a titanium (Ti) film forming device 114, a pre-cleaning device 115, a titanium nitride (TiN) film forming device 116, an aluminum (Al) film forming device 117, and a cooling chamber 118.

The metal film forming system 100 is used for forming a barrier layer on a semiconductor wafer in which a contact hole and/or a via hole are formed and forming a metal layer (Al wiring) by burying Al within the hole on the barrier layer thus formed. Specifically, the transfer arm 119 takes out one sheet of a semiconductor wafer from the cassette chamber 111 and tranfers the semiconductor wafer into the pre-cleaning device 115 so that a native oxide film on a surface of the semiconductor wafer is removed by plasma etching.

Subsequently, the transfer arm 119 transfers the semiconductor wafer into the degassing chamber 113 so that a degassing process is performed on the semiconductor wafer. Subsequently, the transfer arm 119 transfers the semiconductor wafer into the Ti film forming device 114 so as to form a Ti film and then transfers it into the TiN film forming device 116 so as to form a TiN film as a barrier layer. Further, the Al wiring is formed on the semiconductor wafer by the Al film forming device 117. Finally, the semiconductor wafer is cooled in the cooling chamber 118 and is transferred into the cassette chamber 112.

Accordingly, the barrier layer and the metal layer (Al wiring) which is formed on the barrier layer and is conducted to an impurity diffusion region are formed on, for example, the semiconductor wafer in which the contact hole if formed, wherein the contact hole passes through an interlayer insulating film to the impurity diffusion region.

In semiconductor manufacturing, a plasma processing apparatus is used as a plasma etching apparatus as well as a plasma CVD apparatus. A film formed by the CVD of the plasma CVD has an improved step coverage, compared to a film formed by sputtering. Therefore, the CVD is more favorable than the sputtering, when a barrier layer is needed to be formed inside the contact hole, the via hole and the like, for example, for the case of the metal film forming system 100.

However, in the CVD, a material of a film needs to be vaporized to be supplied into a chamber. A vaporizing device of the material of a film is one of the factors for preventing a reduction in a manufacturing cost in a CVD apparatus. Further, in the CVD, a vaporable material of a film needs to be used. Therefore, in the CVD, available materials for a film are limited. This limitation can be a factor increasing the manufacturing cost since high price materials may have to be used in the manufacturing process, depending on a kind of films to be formed. For example, iridium (Ir) is used as a material in an electrode film of lead zirconate titanate (PZT) which is noticed as a material for ferroelectric RAM. However, the materials for forming an Ir film by metal organic CVD (MOCVD) is very expensive.

[Patent Reference 1] Japanese Patent Laid-open Application No. 2002-237486

[Patent Reference 2] Japanese Patent Laid-open Application No. 2003-124201

SUMMARY OF THE INVENTION

It is, therefore, an object of the present invention to provide a new plasma processing apparatus which is capable of forming a film, without using a vaporable material in the film and without using a vaporizing device for the material of the film.

When a new plasma processing apparatus not needing a vaporizing device is realized, a difficulty encountered in performing etching processing and CVD processing in one processing apparatus is reduced. Therefore, it is an object of the present invention to provide a new plasma processing apparatus which is suitable for performing both etching processing and CVD processing.

In accordance with an embodiment of the present invention, there is provided a plasma processing apparatus including a processing chamber; plasma generating unit for generating a plasma of a gas supplied into the processing chamber; a substrate mounting table, disposed in the processing chamber, for mounting a semiconductor substrate having a surface on which a film is to be formed; a metal member disposed in the processing chamber to be etched by the plasma generated in the processing chamber to release a precursor of the film into the processing chamber; a gas supply unit for supplying a gas including halogen atoms into the processing chamber; a first wiring for supplying a first high frequency power to the metal member to attract the plasma generated in the processing chamber to the metal member; and a second wiring for supplying a second high frequency power to the substrate mounting table to attract the plasma generated in the processing chamber to the semiconductor substrate.

It is preferable that the gas supply unit of the plasma processing apparatus supplies a first gas and a second gas which includes the halogen atoms and is different from the first gas.

In accordance with another embodiment of the present invention, there is provided a plasma processing apparatus including a processing chamber; a plasma generating unit for generating a plasma of a gas supplied into the processing chamber; a substrate mounting table, disposed in the processing chamber, for mounting a semiconductor substrate having a surface on which an etching and/or a film forming process is to be carried out; a metal member disposed in the processing chamber and to be etched by the plasma generated in the processing chamber to thereby release a precursor of a film to be formed by the film forming process into the processing chamber; a gas supply unit for supplying a first and a second gas into the processing chamber, wherein the second gas which includes halogen atoms and is different from the first gas; a first wiring for supplying a first high frequency power to the metal member to attract the plasma generated in the processing chamber to the metal member; and a second wiring for supplying a second high frequency power to the substrate mounting table to attract the plasma generated in the processing chamber to the semiconductor substrate.

In the plasma processing apparatus in accordance with the present invention, the precursor of the film to be formed is generated by performing plasma etching process on a metal member disposed in a processing chamber. Therefore, no vaporable material for the film needs to be used and no vaporizing device for the material of the film needs to be prepared.

Further, in the plasma processing apparatus in accordance with the present invention, the first high frequency power is supplied to the metal member and the second high frequency power is supplied to the substrate mounting table. The density distribution of plasma in the processing chamber is suitably controlled by adjusting these powers, so that film forming on a semiconductor substrate is broadly controlled. That is, in the present invention, since the metal member is disposed in the processing chamber and the high frequency power is supplied to each of the metal member and the substrate mounting table, the film forming is easily and broadly controlled.

Furthermore, in accordance with the present invention, the plasma processing apparatus which can be used for both the etching processing and CVD processing is provided. The plasma processing apparatus significantly reduces an equipment investment compared with a film forming system which includes separate etching and CVD apparatuses.

The plasma processing apparatus in accordance with the present invention may further include a high frequency power supply. In such a case, the first wiring and the second wiring may be connected to the high frequency power supply through a switching device which connects the high frequency power supply to one of the first and the second wiring.

Alternatively the plasma processing apparatus in accordance with the present invention may further include a first and a second high frequency power supply respectively connected to the first and the second wiring.

In the former case, a high frequency power need not to be prepared for each wiring. In the latter case, a suitable high frequency power can be used for each wiring.

It is preferable that the plasma processing apparatus in accordance with the present invention further includes a power application controller, wherein the power application controller includes a unit for sequentially performing: a first step of attracting the plasma to the metal member by supplying the first high frequency power to the metal member through the first wiring to etch the metal member by the plasma; and a second step of attracting the plasma including the precursor of the film to the semiconductor substrate by supplying the second high frequency power to the substrate mounting table through the second wiring to adhere the precursor of the film onto the semiconductor substrate.

The power application controller controls the density distribution of the plasma to be suitable for the film forming process by the first and second high frequency power. The precursor of the film is, for example, a compound having a halogen atom and a metal atom released from the metal member.

It is also preferable that the plasma processing apparatus in accordance with the present invention further includes a power application and gas supply controller, which includes a unit for performing film forming control of forming the film on the surface of the semiconductor substrate, wherein the film forming control sequentially performs: a first step of supplying the second gas from the gas supply unit into the processing chamber to generate a plasma of the second gas in the processing chamber by the plasma generating unit, and then attracting the plasma of the second gas to the metal member by supplying the first high frequency power to the metal member through the first wiring to thereby generate the precursor of the film by etching the metal member; and a second step of attracting the plasma including the precursor of the film to the semiconductor substrate by supplying the second high frequency power to the substrate mounting table through the second wiring while maintaining the plasma in the processing chamber by the plasma generating unit, thereby adhering the precursor of the film onto the semiconductor substrate.

The film forming control may sequentially perform: a first step of supplying the first gas from the gas supply unit into the processing chamber to generate a plasma of the first gas in the processing chamber by the plasma generating unit, and then attracting the plasma of the first gas to the metal member by supplying the first high frequency power to the metal member through the first wiring to thereby generate a first precursor of the film by performing the etching process of the metal member; and a second step of supplying the second gas from the gas supply unit into the processing chamber to generate a second precursor of the film by having the first precursor of the film to react with the second gas, and attracting the plasma including the second precursor of the film to the semiconductor substrate by supplying the second high frequency power to the substrate mounting table through the second wiring while maintaining the plasma in the processing chamber by the plasma generating unit, thereby adhering the second precursor of the film onto the semiconductor substrate.

The power application and gas supply controller may further perform etching process control of etching the surface of the semiconductor substrate before performing the film forming control, wherein the etching process control may perform the steps of: supplying the first gas from the gas supply unit into the processing chamber to generate a plasma of the first gas in the processing chamber by the plasma generating unit; and attracting the plasma of the first gas to the semiconductor substrate by supplying the second high frequency power to the substrate mounting table through the second wiring to thereby etch the surface of the semiconductor substrate.

It is preferable that the metal member of the plasma processing apparatus in accordance with the present invention is disposed to be spaced apart from the substrate mounting table, which makes it easy to control the film forming process by controlling the density distribution of the plasma.

It makes to control the film forming by controlling the density distribution of the plasma easy.

The plasma processing apparatus in accordance with the present invention may further include a holder in the processing chamber for detachably holding the metal member.

The metal member needs to be replaced because it is consumed by etching. Further, the metal member needs to be selected depending on a kind of a film. Therefore, placing the holder for detachably holding the metal member in the processing chamber would make it convenient to replace the metal member. In the plasma processing apparatus of the present invention, only the holder is prepared in the processing chamber and then a required the metal member for a film to be formed may be held in the holder when forming the film. However, the plasma processing apparatus with accordance with the present invention does not necessarily equipped with the holder for the metal member and only the metal member may be employed without using the holder.

It is preferable that the holder holds a plurality of metal members.

It is preferable that the holder is a ring shaped member for holding the metal member on its inner peripheral wall surface.

When the metal members are disposed at nearly equal intervals, it is easy to realize homogeneous film forming on the semiconductor substrate.

It is preferable that the metal member includes, e.g., one or more of platinum, ruthenium, iridium, tantalum, germanium, tungsten, chromium, hafnium, nickel, cobalt, molybdenum and titanium.

When the present invention is applied to such metals as iridium, platinum and hafnium whose CVD film forming materials are highly expensive, film forming costs would be greatly significantly reduced.

It is preferable that the gas including the halogen atoms is a hydrogen chloride gas, a chlorine gas, a fluoric gas, a fluorocarbon gas, or a hydrogen bromide gas.

If needed, a nonreactive gas or a reductive gas (for example, a hydrogen ($H_2$) gas) may be supplied from the gas supply unit.

Further, in addition to the nonreactive gas such as an argon gas or the like, a gas such as a hydrogen gas, a nitrogen gas, an oxygen gas and the like may be used as the first gas. It is preferable that the first gas may not include halogen atoms.

The gas supply unit may further supplies a third gas to react with the precursor of the film adhered onto the semiconductor substrate, and the third gas is different from the second gas.

In this case, the power application and gas supply controller may further perform, after the second step, a third step of generating a plasma of the third gas supplied from the gas supply unit into the processing chamber by the plasma generating unit, and attracting the plasma of the third gas to the semiconductor substrate by supplying the second high frequency power to the substrate mounting table through the second wiring to process the precursor (e.g., the second precursor) of the film adhered onto the semiconductor substrate by the plasma of the third gas.

It is preferable that the third gas is a gas, for example, for reducing the precursor of the film, but it is not limited thereto. The third gas may be a nitrogen gas, an oxygen gas or the like.

The reductive gas may be hydrogen gas, silane ($SiH_4$), ammonia ($NH_3$), methane ($CH_4$), ethylene ($C_2H_4$), and the like. The third gas may not include the halogen atoms.

The plasma processing apparatus of the present invention may further include a heater for heating the semiconductor substrate, wherein the power application and gas supply controller may further performs, after the second step, a third step of processing the precursor of the film adhered onto the semiconductor substrate by heating the semiconductor substrate using the heater.

Processing the precursor of the film (for example, reduction) may be performed by employing both of the plasma of the third gas and the heating by the heater.

The plasma processing apparatus of the present invention may further include a shutter mechanism for controlling the contact between the metal member and the plasma.

The shutter mechanism makes it easy to control the film forming process. When the shutter mechanism is prepared, the metal member is prevented from being uselessly consumed or when a substrate processing other than the film forming process is carried out, a surface of a semiconductor substrate is prevented from being contaminated by the precursor of the film released in the processing chamber.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE PREFERRED EMBODIMENTS

The present invention will be described more fully hereinafter with reference to the accompanying drawings, in which preferred embodiments of the invention are shown. Same numbers refer to same elements, and any redundant descriptions may be omitted.

First Embodiment

Figure 1:
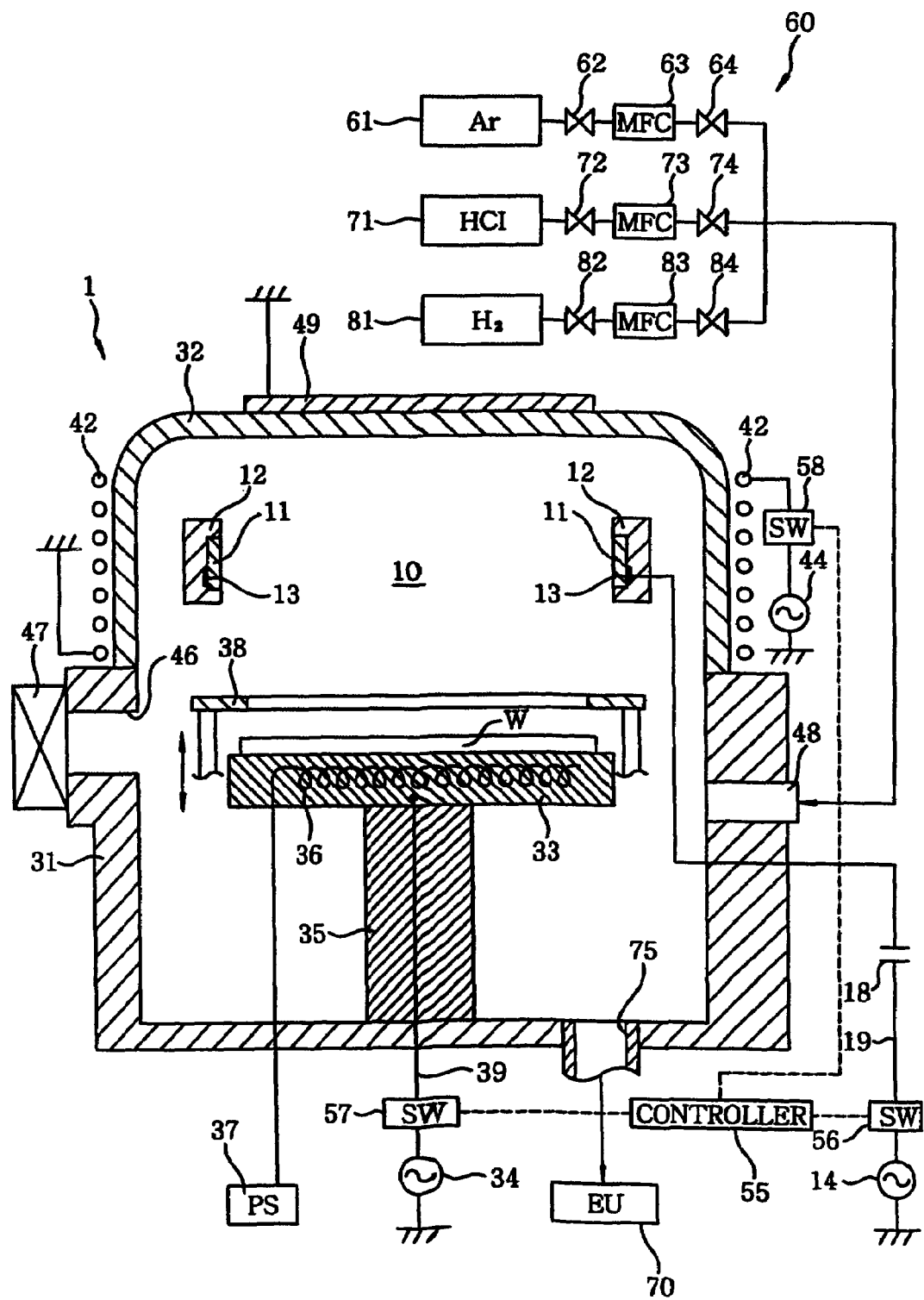
FIG. 1 shows a sectional view of a plasma processing apparatus in accordance with a first embodiment of the present invention.

FIG. 1 is a sectional view of an example of a plasma processing apparatus 1 in accordance with an embodiment of the present invention.

The plasma processing apparatus 1 includes a processing chamber including a nearly cylindrical chamber 31 and a nearly cylindrical bell jar 32. The jar 32 is prepared at an upper side of the chamber 31 and is airtightly connected to the chamber 31. A space 10 within the processing chamber with the chamber 31 and the bell jar 32 (hereinafter, referred to as 'processing space') can be depressurized by a depressurizing device, which will be described later.

In the chamber 31, a susceptor 33 and a cylindrical supporting member 35 are disposed, wherein the susceptor 33 supports thereon a semiconductor wafer W horizontally and the supporting member 35 supports the susceptor 33. Although the susceptor 33 is made of an electric conductor, its surface supporting the semiconductor wafer W is covered with an insulator, such as quartz, and the like. On the outside of an upper wall of the bell jar 32, a grounded conductive member 49 is disposed to oppositely face the susceptor 33 through the upper wall of the bell jar 32.

The bell jar 32 is made of an insulator, such as quartz, ceramic, and the like. The outer periphery of a side of the bell jar 32 is wound with a coil 42. The coil 42 is connected to a high frequency power supply 44 for supplying a high frequency power. When the high frequency power is supplied from the high frequency power supply 44 to the coil 42, an induced electromagnetic field is formed within the bell jar 32 so that a plasma is generated in the processing space 10 by the induced electromagnetic field. In this way, the coil 42 and the high frequency power supply 44 function as a plasma generating unit for generating inductively coupled plasma (ICP). As will be described later, in the first embodiment, the susceptor 33, a second high frequency power source 34 and the conductive member 49 are used in igniting the plasma as parts of the plasma generating unit.

Figure 2:
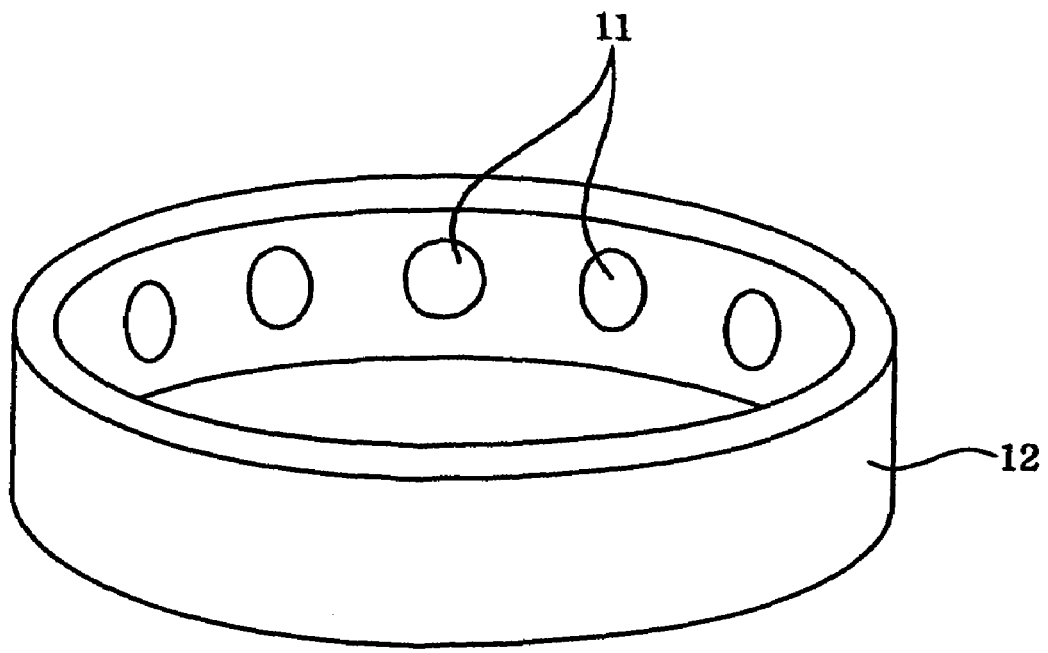
FIG. 2 describes a perspective view of a holder 12 shown in FIG. 1.

Inside the bell jar 32, a holder 12 holding a metal member 11 which is a material used for etching is disposed along the inner periphery of the side. As illustrated in FIG. 2, the holder 12 is a member of a ring shape. A plurality of metal members 11 are detachably held, at equal intervals, on the inner peripheral wall of the holder 12. The holder 12 is made of an insulator, such as quartz, silicon carbide, and the like. The holder 12 is fixed onto the inner wall of the bell jar 32 by a support (not shown). When a different kind of a film is to be formed or the metal member 11 is consumed by etching, the metal member 11 is replaced. As the metal member 11, a disc-shaped metal material available as a sputtering target in the market may be used.

In the holder 12, an electrode 13 of a ring shape is disposed to be electrically connected to the metal member 11. The electrode 13 is connected to a first high frequency power supply 14 through a first wiring 19. A capacity device (capacitor) 18 is inserted between the electrode 13 of the first wiring 19 and the first high frequency power supply 14. The capacitor 18 is inserted to attract the plasma generated in the processing space 10 to the metal member 11 which is an electric conductor.

The susceptor 33 is connected to the second high frequency power supply 34 through a second wiring 39. When a high frequency power is supplied from the second high frequency power supply 34 to the susceptor 33, an electric field is formed between the susceptor 33 and the conductive member 49. The electric field is perpendicular to the semiconductor wafer W. The perpendicular electric field is used for ignition of the plasma. The high frequency power supplied from the high frequency power supply 34 to the susceptor 33 attracts the plasma generated in the processing space 10 towards the semiconductor wafer W.

In the susceptor 33, a heater 36 is embedded and is connected to a power supply PS 37. When a power is supplied from the power supply PS 37 to the heater 36, the heater 36 functions as a heating unit for heating the semiconductor wafer W to be kept at a predetermined temperature. Above the susceptor 33, a clamp ring 38 is disposed for clamping the outer edge of the semiconductor wafer W loaded on the susceptor 33 so as to be stably held thereon. The clamp ring 38 is movable up and down by a elevating mechanism (not shown). The clamp ring 38 clamps the semiconductor wafer W while moving down.

An opening 46 is formed at a sidewall of the chamber 31. A gate valve 47 is installed at the opening 46. While the gate valve 47 is opened, the semiconductor wafer W is transferred between an adjacent transfer chamber (not shown) and the chamber 31 by a transfer arm. A gas supply nozzle 48 is disposed at a sidewall of the chamber 31. Through the gas supply nozzle 48, gas supplied from a gas supply unit 60 flows into the processing space 10.

The gas supply unit 60 is made, for example, to supply three kinds of gases. The gas supply unit 60 includes: an Ar gas source 61, an HCl gas source 71 and a $H_2$ gas source 81; mass flow controllers 63, 73 and 83 respectively connected to the gas sources 61, 71 and 81; opening/closing valves 62, 64, 72, 74, 82 and 84 which are respectively positioned before and after the mass flow controllers 63, 73 and 83 as shown. The gas supply unit 60 supplies each gas controlled at a predetermined flow rate into the processing space 10 through the gas supply nozzle 48.

One end of an evacuation line 75 is connected to a bottom of the chamber 31. The other end of the exhaust conduit 75 is connected to an evacuation unit EU 70 including a vacuum pump. The processing space 10 is depressurized to a predetermined degree of vacuum by the evacuation unit EU 70. The evacuation unit 70 functions as a depressurizing device for decompressing the processing space 10 to be maintained at the predetermined degree of vacuum.

The plasma processing apparatus 1 includes a controller 55 and switching devices SW 56, 57 and 58 being connected to the controller 55 and being switched by signals from the controller 55. The switching devices SW 56, 57 and 58 control the supply of the high frequency power from each of the high frequency power supplies 14, 34 and 44. Although it is not illustrated in FIG. 1, the controller 55 may be connected to the mass flow controllers 63, 73 and 83 and the evacuation unit EU 70, for controlling the controllers and unit.

As it is apparently shown in the configuration of the plasma processing apparatus shown in FIG. 1, the high frequency power from the first high frequency power supply 14 and the high frequency power from the second high frequency power supply 34 are independently controlled to be supplied. The metal member 11 and the susceptor 33, to which the high frequency powers are respectively supplied, are electrically separated from each other. Further, the supply of the high frequency power from the high frequency power supply 44 is controlled, independently from the control of the supply of the high frequency powers from the first and second high frequency power supply 14 and 34.

An example of the film forming by using the plasma processing apparatus 1 will be described below. For example, a titanium (Ti) film will be formed on the semiconductor wafer W. In this case, the metal member 11 uses a member made of Ti.

While the gate valve 47 is opened, the transfer arm disposed in the adjacent transfer chamber (not shown) loads the semiconductor wafer W into the processing space 10 from the transfer chamber through the gate valve 47 and transfers the wafer W on supporting pins (not shown) in the susceptor 33. Subsequently, the supporting pins are moved down to be within in the susceptor 33 so that the wafer W is mounted on the susceptor 33. Then, the clamp ring 38 is moved down to clamp the outer edge of the wafer W. Subsequently, the gate vale 47 is closed and the gas inside the processing space 10 is evacuated through the evacuation line 75 by using the evacuation unit EU 70 so that the processing space 10 is maintained at a predetermined decompression condition (for example, about 1 mTorr (133.3 mPa)).

Subsequently, the Ar gas is supplied from the gas supply unit 60 into the decompressed processing space 10, at a predetermined flow rate (for example, 300 sccm). While the Ar gas is supplied, the high frequency power is supplied from the second high frequency power supply 34 to the susceptor 33 through the second wiring 39, so that an electric field perpendicular to the semiconductor wafer W is formed between the susceptor 33 and the conductive member 49. Ar gas is excited by the electric field, thereby igniting plasma. The high frequency power supplied from the second high frequency power supply 34 may be, for example, 13.56 MHz in frequency and, for example, 500 W in power.

After the plasma ignition, a high frequency power is supplied from the high frequency power supply 44 to the coil 42 so that an induced electromagnetic field is formed within the bell jar 32, and supplying the high frequency power from the second high frequency power supply 34 to the susceptor 33 is stopped. Thereafter, the plasma is maintained by the induced electromagnetic field formed within the bell jar 32 by supplying the high frequency power from the high frequency power 44 to the coil 42. The high frequency power supplied from the high frequency power supply 44 may be, for example, 13.56 MHz in frequency and, for example, 500 W in power.

While the plasma is maintained, the flow rate of the Ar gas is decreased and the HCl gas is supplied from the gas supply unit 60. Then, the flow rate of the Ar gas may be, for example, 1 sccm and the flow rate of the HCl gas may be, for example, 10 slm. The plasma allowing the corrosive gas, such as the HCl gas, to be excited has the property of etching metal. For example, when Ti is in contact with the plasma of the HCl gas, titanium chloride (TiClx) which is a precursor of the film (Ti film) to be formed is released.

To efficiently release the precursor of the film, the density of the plasma nearby the metal member 11 may be increased. The density distribution of the plasma can be changed by supplying the high frequency power (the first high frequency power) from the first high frequency power supply 14 to the metal member through the first wiring 19 and the electrode 13 while supplying the HCl gas. The plasma generated in the processing space 10 is attracted to the metal member 11 by the supply of the high frequency power to the metal member 11, so that the density of the plasma nearby the metal member 11 becomes high.

As Ti of the metal member 11 is etching processed, titanium chloride which is the precursor of the film is released into the processing space 10. The quantity of the precursor of the film released depends on the density of the plasma in the space nearby the metal member 11. Therefore, the quantity of the precursor of the film released is controlled by controlling the application of the high frequency power to the metal member 11, specifically, by controlling the frequency and power of the high frequency power. To attract the plasma to the metal member 11, the high frequency power supplied from the first high frequency power supply 14 may be, for example, 450 kHz in frequency and, for example, 1000 W in power.

Thereafter, the supply of the high frequency power from the first high frequency power supply 14 is stopped and the high frequency power (the second high frequency power) from the second high frequency power supply 34 is supplied to the susceptor 33 through the second wiring 39, so that the plasma containing the precursor of the film is attracted to the semiconductor wafer W mounted on the susceptor 33. Therefore, the precursor of the film released from the metal member 11 is deposited on the semiconductor wafer W. To attract the plasma to the susceptor 33, the frequency and power of the high frequency power supplied from the second high frequency power supply 34 may be kept same as those upon the plasma ignition.

Subsequently, the precursor of the film deposited on the semiconductor wafer W is reduced to be a metal film. When the heater 36 is electrified from the power supply PS 37 and heats the semiconductor wafer W at a temperature ranging from about 50 to 800° C., the reduction of the film is performed. Thereby, the metal film (here, the Ti film) is formed on the semiconductor wafer W.

The reduction of the film may be performed by the heating and the processing by using the reductive plasma. In this case, the semiconductor wafer W is heated at the above-described temperature by the heater being electrified from the power supply PS 37, and reductive plasma is generated in the processing space 10 by stopping supply of the HCl gas and supplying the Ar gas and $H_2$ gas at respective predetermined flow rates into the processing space 10 from the gas supply unit 60. The $H_2$ gas is supplied from the $H_2$ gas source 81. Then, the flow rate of the Ar gas may be, for example, 300 sccm and the flow rate of the $H_2$ gas may be, for example 50 sccm. Consequently, the reductive plasma is attracted to the semiconductor wafer W by the high frequency power supplied from the second high frequency power supply 34 to the susceptor 33.

After the film forming is ended, the quantity of evacuation by the evacuation unit EU 70 and the quantity of the gas supply from the gas supply unit 60 are controlled so that the degree of vacuum in the processing space 10 is identical with that of the transfer chamber. Thereafter, the semiconductor wafer W is released from the clamp ring 38, and the supporting pins (not shown) are moved up from the susceptor 33 to lift the wafer W. When the gate valve 47 is opened, the transfer arm enters the chamber 31 to carry out the wafer W into the transfer chamber. Thereby, the film forming process in the plasma processing apparatus 1 is ended.

An example of the film forming by using the plasma processing apparatus 1 has been described above. However, the plasma processing apparatus 1 is applicable to an etching process. Thus, the etching process (pre-cleaning processing for removing a native oxide film) that is performed on a surface of a semiconductor wafer W before the Ti film forming will be described below. Gases used for the pre-cleaning processing are an Ar gas and an $H_2$ gas. However, since the gas sources (61 and 81) of these gases are already prepared to be used for the Ti film forming, the configuration of the plasma processing apparatus shown in FIG. 1 need not be changed for this example of the etching processing. However, when the gas used for the etching process is different from the Ar gas and $H_2$ gas, a corresponding gas source needs to be added in the gas supply unit 60.

The loading of the semiconductor wafer W, the plasma ignition by introducing the Ar gas and supplying the high frequency power to the susceptor 33, and maintaining plasma by supplying the high frequency power to the coil 42 are performed in the same manner as described above.

While the plasma is maintained, the flow rate of the Ar gas is decreased and the $H_2$ gas, which is a reductive gas, is supplied from the $H_2$ gas source 81 by using the gas supply unit 60. Then, the flow rate of the Ar gas may be, for example, 300 sccm and the flow rate of the $H_2$ gas may be, for example, 50 sccm. Thereby, the reductive plasma is generated in the processing space 10.

Subsequently, the high frequency power is supplied from the second high frequency power supply 34 to the susceptor 33 through the second wiring 39, to attract the plasma to the semiconductor wafer W, so that the surface of the semiconductor wafer W is etching processed by using the plasma. The frequency and power of the high frequency power supplied from the second high frequency power source 34 may be identical with those of the power applied to attract the plasma in the film forming process. This etching process removes the native oxide (for example, SiOx) of Si, CoSi, W, WSi, TiSi, and the like, formed on the surface of the semiconductor wafer W. The etching of native oxide can be accomplished by the plasma of the Ar gas only (i.e., without using the reductive gas of $H_2$). The semiconductor wafer W after the etching processing is unloaded in the same manner as described above.

As described above, the etching process and the film forming performed while the high frequency power being supplied may be carried out by using the controller 55 for controlling the supply of the power, and the like. As illustrated in FIG. 1, the controller 55 is connected to the switching devices SW 56, 57 and 58 and controls these devices to be switched. Further, although it is not shown, the controller 55 is connected to the mass flow controllers 63, 73 and 83, the evacuation unit EU 70, the power supply PS 37, and the like so that it controls an operation of each member indicated in FIG. 1.

The controller 55 may include a memory storing a predetermined program, for example, for controlling the switch of the switching devices SW 56, 57 and 58 to perform the etching process or film forming as described above, and a central processing unit (CPU) for executing the program.

Further, in the apparatus of FIG. 1, the controller 55 is connected to the switching devices SW 56, 57 and 58 but it is not limited thereto. The controller 55 may be directly connected to the high frequency power supplies 14, 34 and 44 and directly controls these power supplies 14, 34 and 44.

Figure 3:
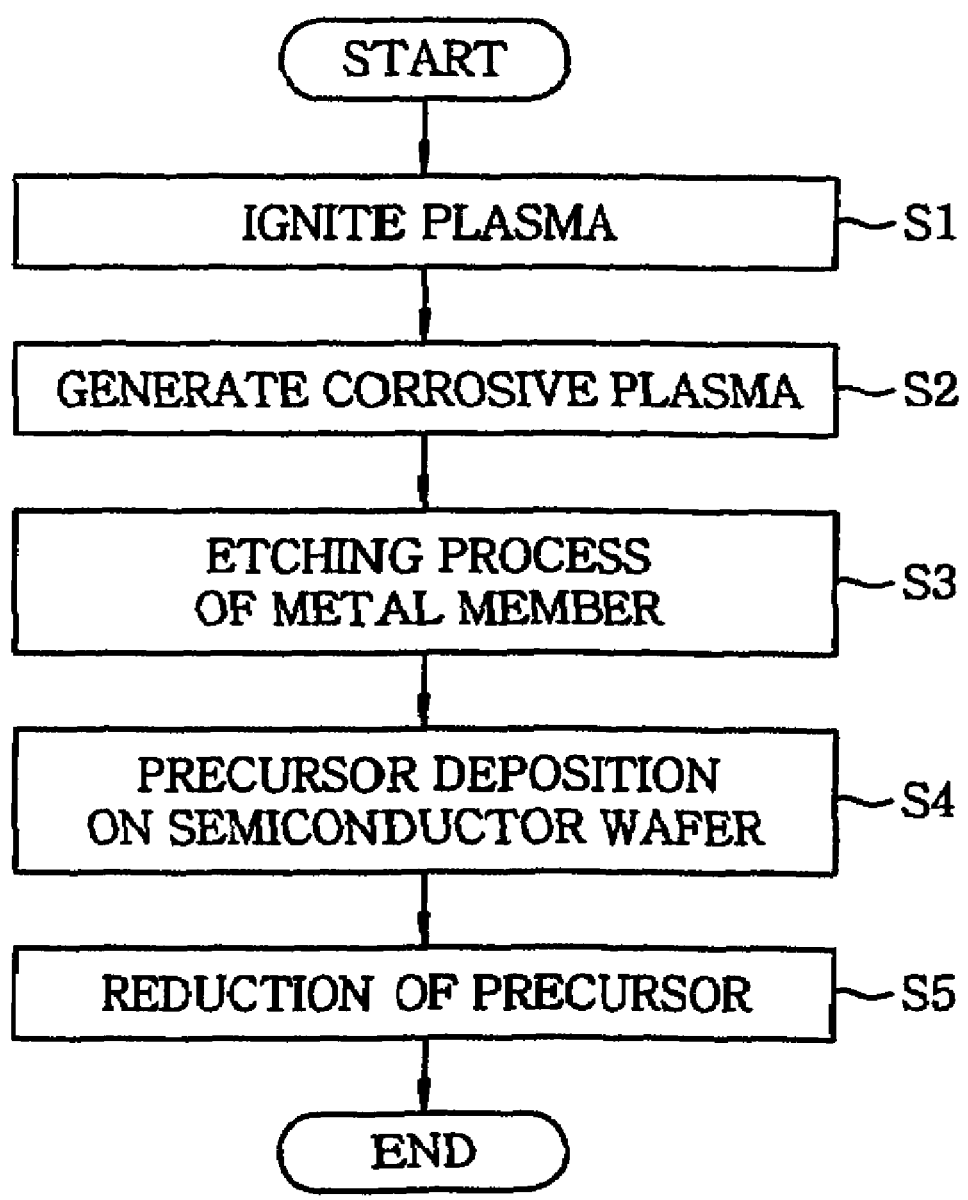
FIG. 3 is a flow chart illustrating an example of control performed by a controller shown in FIG. 1.

FIG. 3 illustrates an example of a control process to be performed by the program stored in the controller 55. The control process is an example of the control process to be applied so as to perform film forming by using the apparatus of FIG. 1.

The control process illustrated in FIG. 3 is started after the semiconductor wafer W is mounted on the susceptor 33 and the processing space 10 is depressurized by the evacuation unit EU 70.

First, in step S1, the controller 55 controls the mass flow controller 63 to allow the Ar gas to be supplied, at a predetermined flow rate, from the gas supply unit 60 into the processing space 10. The controller 55 further controls an opened second switching device SW 57 to be closed to allow the high frequency power to be supplied from the second high frequency power supply 34 to the susceptor 33 through the wiring 39, thereby igniting plasma.

Subsequently, in step S2, the controller 55 controls an opened third switching device SW 58 to be closed to allow the high frequency power to be supplied from the high frequency power supply 44 to the coil 42, and controls the second switching device SW 57 to be opened, to stop the supply of the high frequency power from the second high frequency power supply 34 to the susceptor 33. The controller 55 further controls the mass flow controllers 63 and 73 to decrease the flow rate of the Ar gas and to start the supply of the HCl gas. Thereby, the plasma of the gas containing halogen atoms (corrosive plasma) is generated.

Subsequently, in step S3, the controller 55 controls an opened first switching device SW 56 to be closed to allow the high frequency power to be supplied from the first high frequency power supply 14 to the metal member 11. Thereby, the plasma is attracted to the metal member 11 so that the etching process of the metal member 11 is performed. Steps S2 and S3 may be overlapped upon performance.

Further, in step S4, the controller 55 controls the first switching device SW 56 to be opened, to stop the supply of the high frequency power from the first high frequency power supply 14, and controls the second switching device SW 57 to be closed again to restart the supply of the high frequency power from the second high frequency power supply 34 to the susceptor 33. Thereby, the precursor of the film is deposited on the semiconductor wafer W.

Thereafter, in step S5, as the semiconductor wafer W is heated by using the heater 36, the precursor of the film is reduced so that a metal film is formed.

Thereby, when the film forming process of the metal film is ended, the semiconductor wafer W is unloaded to the transfer chamber through the gate valve 47.

Unlike the example of the control process shown in FIG. 3, the etching process of the metal member may be performed by the plasma of the Ar gas or the Ar gas and the $H_2$ gas. In this case, before the HCl gas is introduced, the high frequency power is supplied to the metal member 11, thereby etching processing the metal member 11. Thereafter, the HCl gas is supplied. As the HCl gas reacts with Ti (precursor A) released in the processing space 10, TiClx (precursor B) is generated. Thereafter, steps S4 and S5 are performed to form the metal film.

Figure 4:
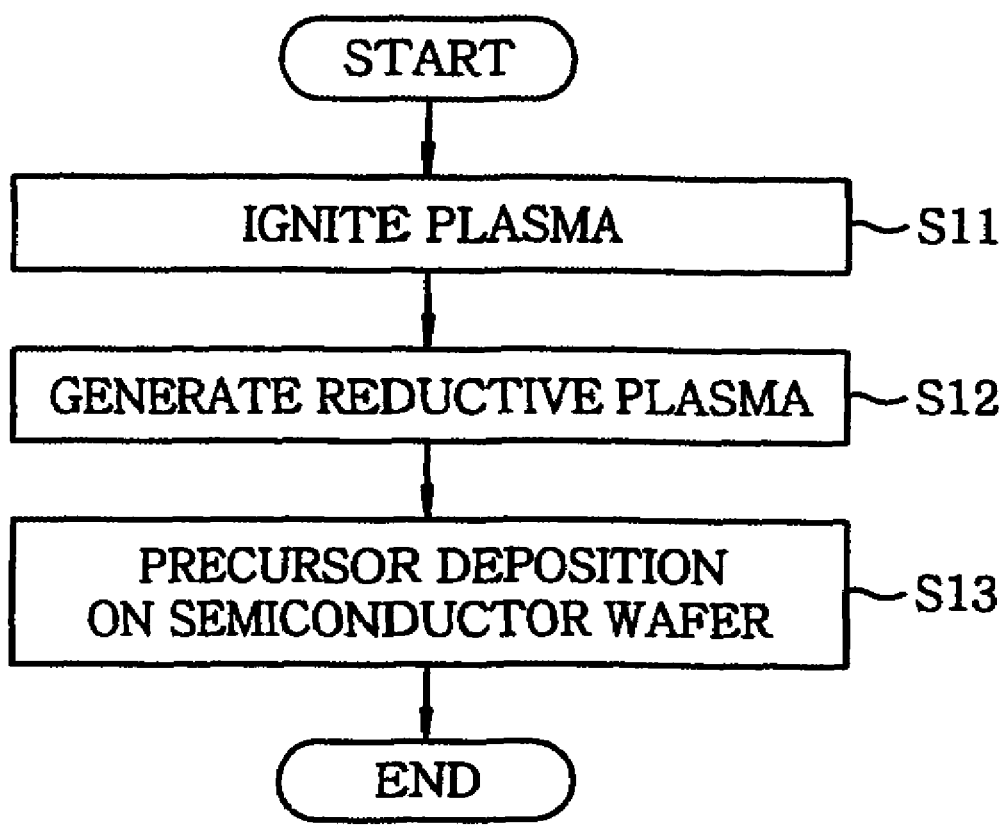
FIG. 4 is a flow chart illustrating another example of control performed by the controller shown in FIG. 1.

FIG. 4 illustrates another example of a control process performed by the controller 55. The control process is another example of the control process to be applied to remove the native oxide film formed on the semiconductor wafer W by the etching process by using the apparatus of FIG. 1.

First, in step S11, the plasma is ignited as in step S1.

Subsequently, in step S12, the opened third switching device SW 58 is closed to start the supply of the high frequency power from the high frequency power supply 44 to the coil 42 and the second switching device SW 57 is opened to stop the supply of the high frequency power from the second high frequency power supply 34 to the susceptor 33. Further, the mass flow controllers 63 and 73 are controlled to decrease the flow rate of the Ar gas and to start the supply of the $H_2$ gas. Thereby, the reductive plasma is generated.

Subsequently, in step S13, the opened switching device SW 57 is closed again to start the supply of the high frequency power from the second high frequency power supply 34 to the susceptor 33. Thereby, the plasma is attracted to the semiconductor wafer W, to perform the etching process of the semiconductor wafer W.

Thus, the process of removing the native oxide film is ended and the semiconductor wafer W is loaded into the transfer chamber through the gate valve 47. Or the semiconductor wafer may be remained in the chamber to be continuously controlled for the film forming.

Second Embodiment

Figure 5:
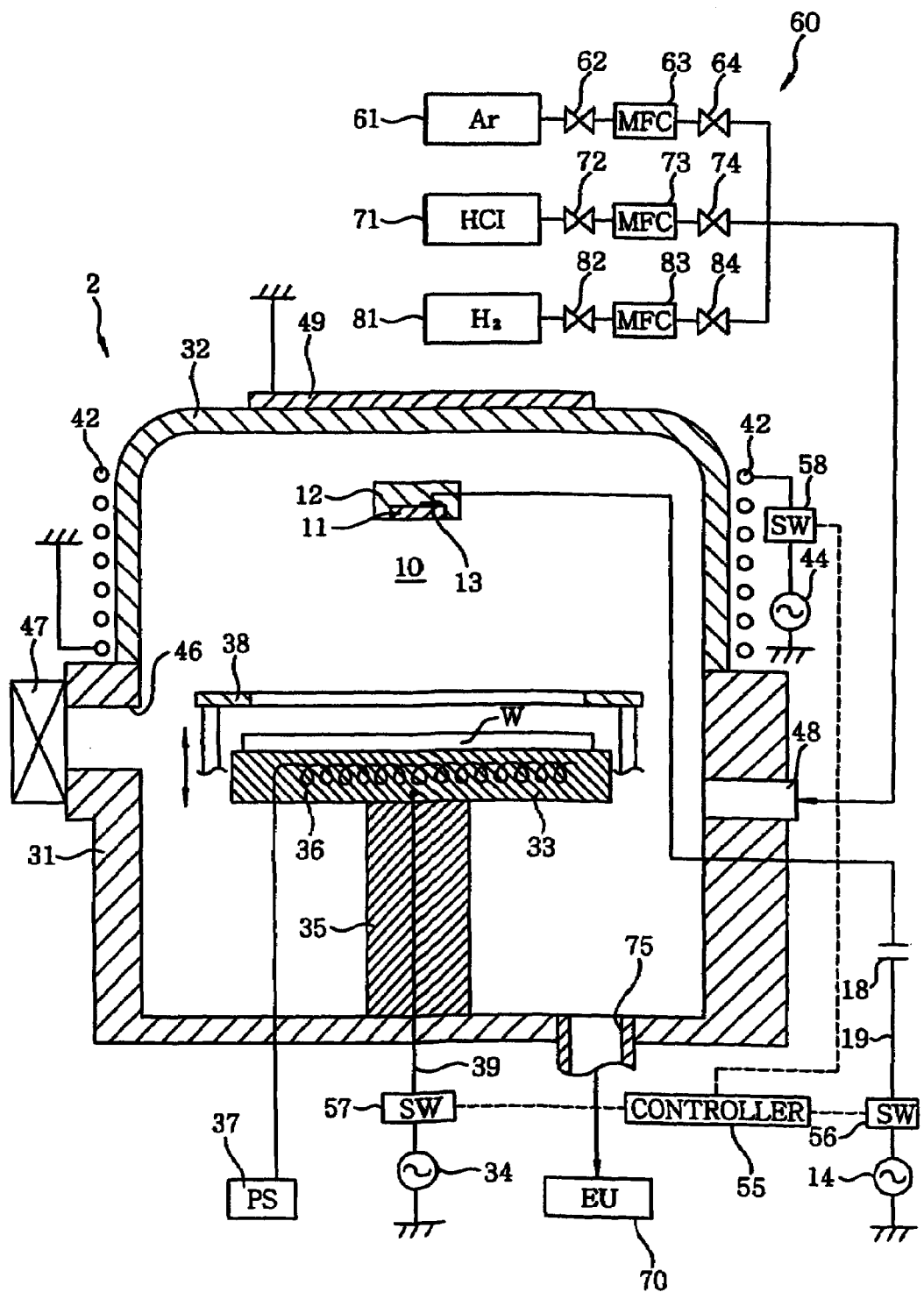
FIG. 5 illustrates a sectional view of a plasma processing apparatus in accordance with a second embodiment of the present invention.

FIG. 5 is a sectional view of a plasma processing apparatus in accordance with another embodiment of the present invention.

The plasma processing apparatus 2 has the same configuration as the plasma processing apparatus 1 of the first embodiment, except for the positions of the holder 12 and the metal member 11 held in the holder 12. In the plasma processing apparatus 2, the metal member 11 is disposed above the semiconductor wafer W in a manner that the surface of the metal member 11 is oppositely facing the surface of the wafer W.

The metal member 11 is etching processed by the plasma attracted by the high frequency power supplied to the metal member 11, so that the precursor of the film is released. As far as the precursor reaches on a substrate to be processed, the metal member is not limited in position in the processing space 10. However, in a typical configuration of the plasma processing apparatus in which a gas is plasmatized in the processing space 10 formed above the semiconductor wafer W and the gas is evacuated through the side lower than the semiconductor wafer W (through the evacuation line 75 positioned at the bottom of the plasma processing apparatus in the present invention), the metal member 11 may be preferably disposed at a higher position than the semiconductor wafer W.

Third Embodiment

Figure 6:
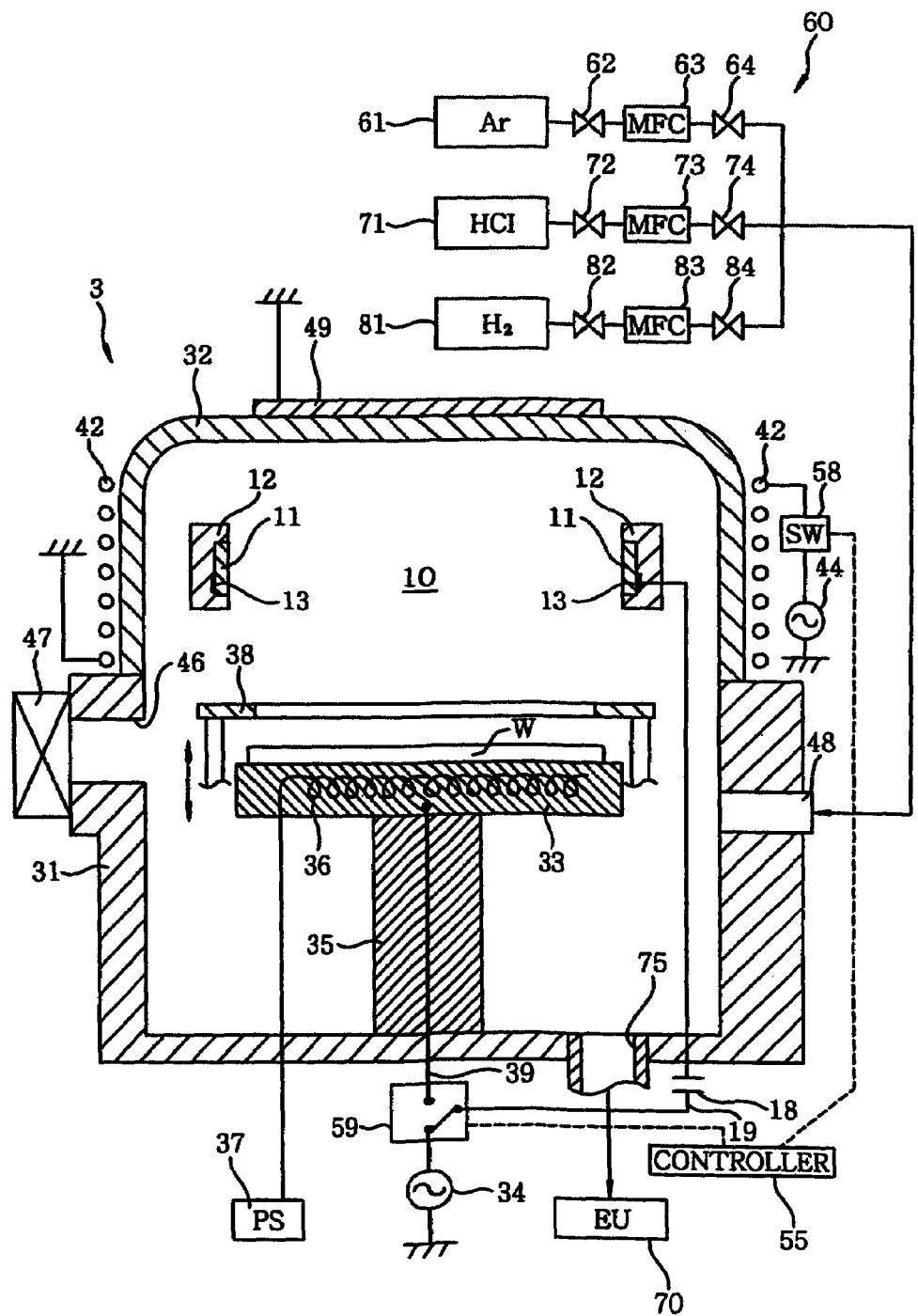
FIG. 6 illustrates a sectional view of a plasma processing apparatus in accordance with a third embodiment of the present invention.

FIG. 6 is a sectional view of a plasma processing apparatus in accordance with another embodiment of the present invention.

The plasma processing apparatus 3 is of the same configuration as the plasma processing apparatus 1 of the first embodiment, except that the first wiring 19 and the second wiring 39 are connected to a same high frequency power supply 34 through a switching device 59. The switching device 59 alternatively selects a wiring for supplying the high frequency power, among the first wiring 19 and the second wiring 39. In the plasma processing apparatus 3, no individual power supply is needed to supply the high frequency power to the metal member 11 and the susceptor 33. In the plasma processing apparatus 3, switching devices for switching the wirings 19 and 39 may be further prepared in the wirings 19 and 39.

Fourth Embodiment

Figure 7:
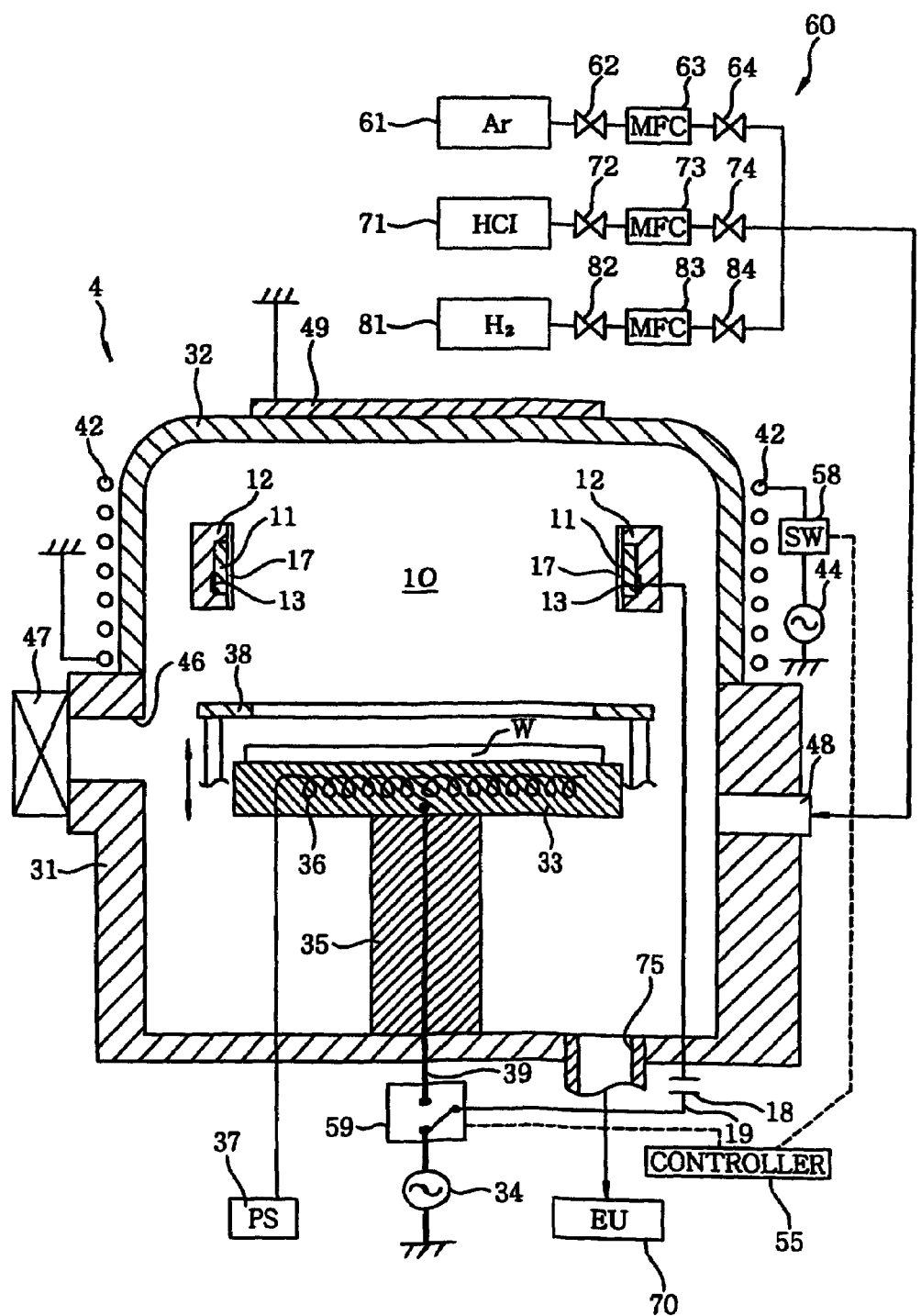
FIG. 7 illustrates a sectional view of a plasma processing apparatus in accordance with a fourth embodiment of the present invention.

FIG. 7 is a sectional view of a plasma processing apparatus 4 in accordance with another embodiment of the present invention.

The plasma processing apparatus 4 has the same configuration as the plasma processing apparatus 3 of the third embodiment, except that the holder 12 additionally includes a shutter 17 for covering the metal member 11.

The shutter 17 is configured such that the extent of its opening and closing can be controlled from the outside of the processing chamber with the chamber 31 and the bell jar 32. The shutter 17 may isolate the metal member 11 from the plasma generated in the processing space 10, by covering the whole surface of the metal member 11. In the case that the metal member 11 need not be etched, the shutter 17 is closed to prevent the etching or sputtering of the metal member 11 even while the plasma is generated.

For example, in the status as illustrated, the high frequency power is supplied from the high frequency power supply 34 to the metal member 11. Thus, when the surface of the metal member 11 is not covered with the shutter 17, it is concerned that the sputtering of the metal member 11 by the Ar plasma occurs, for example, only by performing the plasma ignition by introduction of the Ar gas.

Fifth Embodiment

Figure 8:
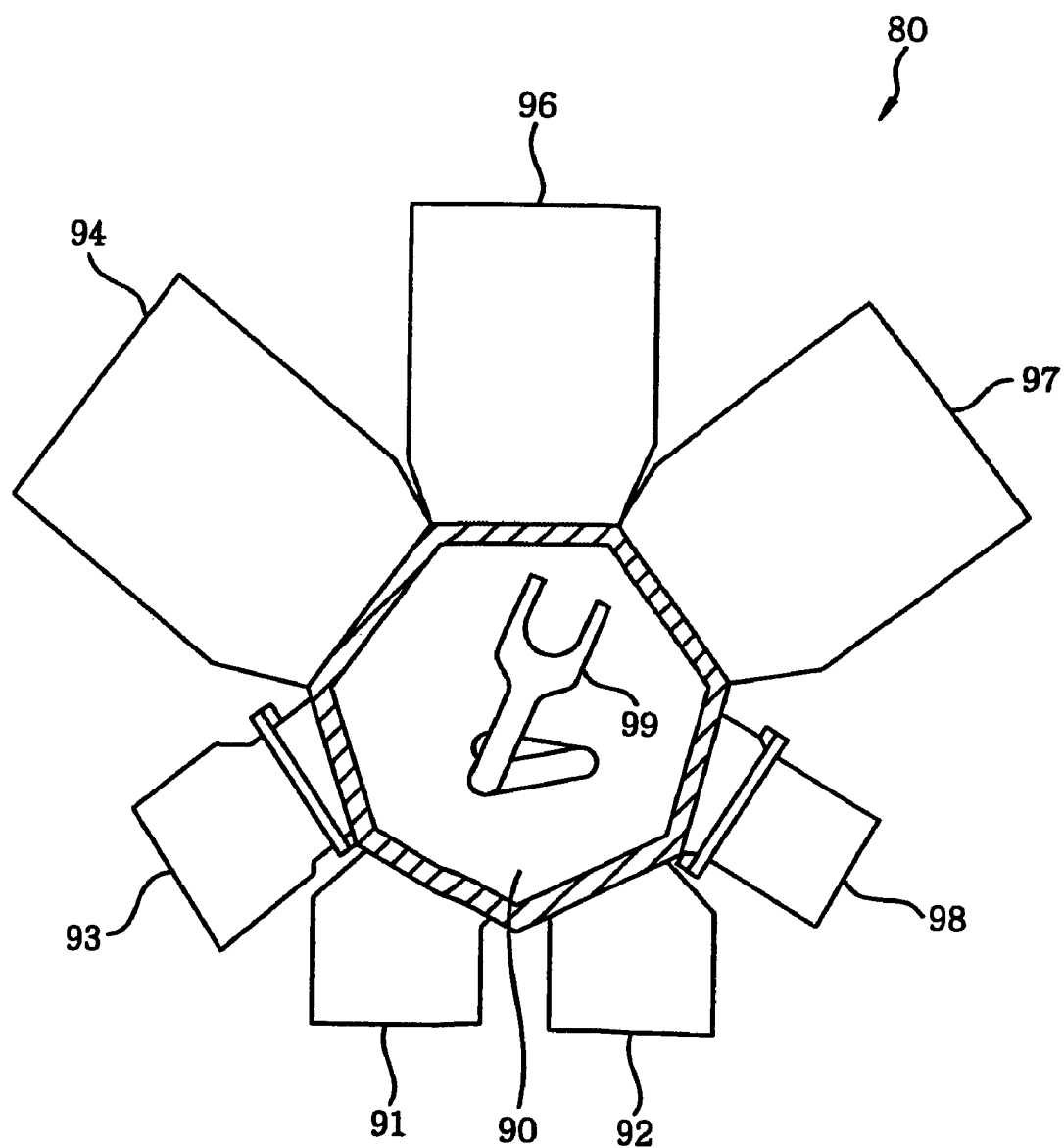
FIG. 8 offers a view of an example of the configuration of a metal film forming system using the plasma processing apparatus in accordance with the present invention.

FIG. 8 is a view illustrating an example of a configuration of a metal film forming system by using a plasma processing apparatus in accordance with the present invention.

The metal film forming system 80 includes a transfer chamber 90, a transfer arm 99, and a group of devices 91, 92, 93, 94, 96, 97 and 98 disposed around the transfer chamber 90. The group of devices includes cassette chambers 91 and 92, a degassing chamber 93, a Ti film forming device and pre-cleaning device 94, a TiN film forming device 96, an Al film forming device 97 and a cooling chamber 98. The Ti film forming device and pre-cleaning device 94 is the plasma processing apparatus in accordance with the present invention.

The metal film forming system 80 is used for forming a barrier layer on a semiconductor wafer W in which a contact hole and/or a via-hole are formed and forming a metal layer (aluminum (Al) wiring) by burying aluminum (Al) within the hole on the barrier layer thus formed. Specifically, the transfer arm 99 takes out one sheet of a semiconductor wafer W from the cassette chamber 91 and transfers it into the pre-cleaning device 94 to be mounted therein so that a native oxide film in the surface of the semiconductor wafer W is removed by plasma etching. Subsequently, the transfer arm 99 transfers the semiconductor wafer W to be mounted in the degassing chamber 93 so that a degassing process is performed on the semiconductor wafer W. Subsequently, the transfer arm 99 transfers the semiconductor wafer W to be mounted in the titanium (Ti) film forming device and pre-cleaning device 94 so as to form a Ti film and then transfers it to be mounted in the titanium nitride (TiN) film forming device 96 so as to form a TiN film as a barrier layer. Further, the Al wiring is formed on the semiconductor wafer W in the Al film forming device 97. Finally, the semiconductor wafer is cooled in the cooling chamber 98 and transferred into the cassette chamber 92.

Thereby, the barrier layer and the metal layer (Al wiring) which is formed on the barrier layer and is conducted with an impurity diffusion region are formed on, for example, the semiconductor wafer that includes the contact hole, which passes through interlayer insulating film to the impurity diffusion region.

Figure 9:
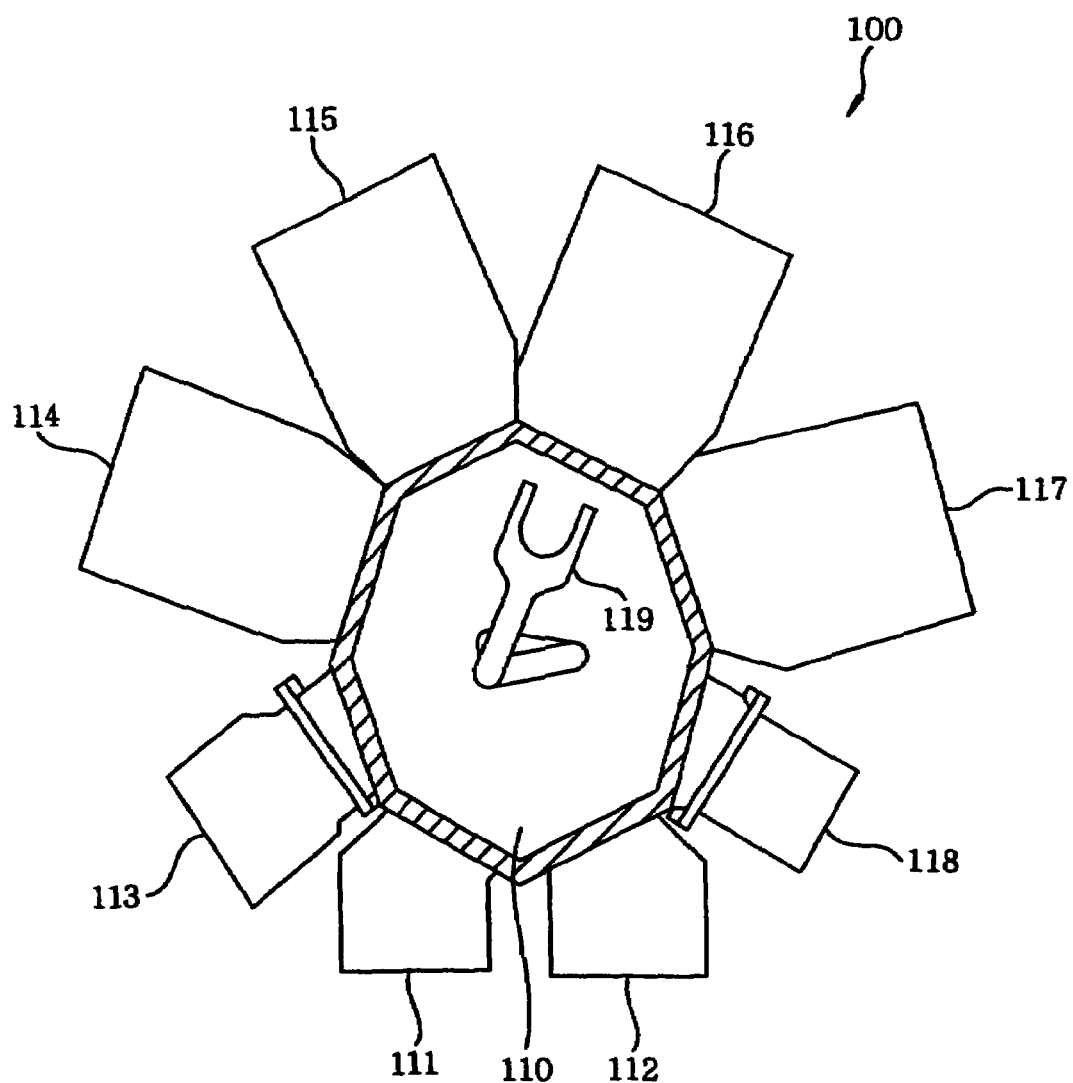
FIG. 9 offers a view of a conventional metal formation system.

Comparing with the conventional metal film forming system 100 shown in FIG. 9, the number of chambers of the metal film forming system 80 is one less than the number of the chambers of the conventional metal film forming system 100 and the configuration thereof is simplified.

The invention has been described by using preferred exemplary embodiments. However, it is to be understood that the scope of the invention is not limited to the disclosed embodiments.

For example, the gas for the etching process of the metal member 11 is not limited to the HCl gas but may use the gas including halogen atoms, such as $Cl_2$, $F_2$, CF group gas, or HBr, and the like. The film to be formed is not limited to the Ti film but may be a metal film of Ir film and the like, a nitride film of TiN, TaN and the like or an oxide film of TaO and the like. When a nitride film is formed, a nitrogen source, such as $N_2$, $NH_3$, and the like, may be prepared in the gas supply unit 60. When an oxide film is formed, an oxygen source, such as $O_2$ and the like, may be prepared in the gas supply unit 60. The metal of the metal member 11 may be suitably selected depending on a kind of metal of the film to be formed.

Further, for example, in each embodiment above, the plasma source is the inductively coupled plasma (ICP) but may be ECR, HWP, SWP and the like. When these plasma sources are used, basically the plasma processing apparatus is configured in the same manner as described above so as to realize the film forming.

Further, for example, the shape of the holder 12 is not limited to the ring shape and the number of the metal members 11 or the number of the holders 12 is not limited. Without using the holder 12, the present invention can be performed. For example, the whole ring-shaped member of FIG. 3 may be used as the metal member.

As described above, the present invention provides an apparatus which realizes a new plasma CVD without any vaporizing device for a material of a film. In the present invention, etching and film forming by CVD are performed by using the same apparatus, which is of significant utility value in the technology field of semiconductor manufacturing.

While the invention has been shown and described with respect to the embodiments, it will be understood by those skilled in the art that various changes and modifications may be made without departing from the scope of the invention as defined in the following claims.

What is claimed is:

1. A plasma processing apparatus comprising:
a processing chamber including a cylindrical bell jar provided at an upper end part of the processing chamber;
a plasma generating unit including a coil wound around an outer periphery of the bell jar and a grounded conductive member disposed on an outer side of an upper wall of the bell jar which generates a plasma of a gas supplied into the processing chamber;
a substrate mounting table, disposed in the processing chamber, which mounts a semiconductor substrate having a surface on which a film is to be formed;
a metal member disposed in the processing chamber to be etched by the plasma generated in the processing chamber to release a precursor of the film into the processing chamber;
a holder in the bell jar which detachably holds the metal member;
a gas supply unit which supplies a gas including halogen atoms into the processing chamber;
a first wiring which supplies a first high frequency power to the metal member to attract the plasma generated in the processing chamber to the metal member;
a second wiring which supplies a second high frequency power to the substrate mounting table to form an electric field between the substrate mounting table and the conductive member and to attract the plasma generated in the processing chamber to the semiconductor substrate; and
a third wiring which supplies a third high frequency power to the coil to form an induced electromagnetic field within the bell jar,
wherein the metal member and the holder are disposed in a plasma generating space in which the plasma is generated by the plasma generating unit, the plasma generating space is provided between an inner side of the upper wall of the bell jar and the substrate mounting table,
wherein the metal member and the holder are surrounded by the coil, and
wherein the metal member and the holder are disposed to be spaced apart from the substrate mounting table and from the upper wall of the bell jar.

2. The plasma processing apparatus of claim 1, wherein the gas supply unit supplies a first gas and a second gas which includes the halogen atoms and is different from the first gas.

3. The plasma processing apparatus of claim 2, further comprising a power application and gas supply controller
configured to supply the second gas from the gas supply unit into the processing chamber to generate a plasma of the second gas in the processing chamber by the plasma generating unit, and configured to supply the first high frequency power to the metal member through the first wiring to then attract the plasma of the second gas to the metal member and thereby generate the precursor of the film by etching the metal member; and
configured to supply the second high frequency power to the substrate mounting table through the second wiring while maintaining the plasma in the processing chamber by the plasma generating unit to attract the plasma including the precursor of the film to the semiconductor substrate, thereby adhering the precursor of the film onto the semiconductor substrate.

4. The plasma processing apparatus of claim 3, wherein the power application and gas supply controller
is configured to supply the first gas from the gas supply unit into the processing chamber to generate a plasma of the first gas in the processing chamber by the plasma generating unit; and
is configured to supply the second high frequency power to the substrate mounting table through the second wiring to attract the plasma of the first gas to the semiconductor substrate to thereby etch the surface of the semiconductor substrate.

5. The plasma processing apparatus of claim 3, wherein the gas supply unit further supplies a third gas to react with the precursor of the film adhered onto the semiconductor substrate, the third gas being different from the second gas, and
wherein the controller is configured to generate a plasma of the third gas supplied from the gas supply unit into the processing chamber by the plasma generating unit, and is configured to supply the second high frequency power to the substrate mounting table through the second wiring to attract the plasma of the third gas to the semiconductor substrate to process the precursor of the film adhered onto the semiconductor substrate by the plasma of the third gas.

6. The plasma processing apparatus of claim 5, wherein the third gas is a gas for reducing the precursor of the film.

7. The plasma processing apparatus of claim 3, further comprising a heater for heating the semiconductor substrate,
wherein the controller is configured to heat the semiconductor substrate using the heater to process the precursor of the film adhered onto the semiconductor substrate.

8. The plasma processing apparatus of claim 2, further comprising a power application and gas supply controller
configured to supply the first gas from the gas supply unit into the processing chamber to generate a plasma of the first gas in the processing chamber by the plasma generating unit, and configured to supply the first high frequency power to the metal member through the first wiring to then attract the plasma of the first gas to the metal member and thereby generate a first precursor of the film by performing the etching process of the metal member; and
configured to supply the second gas from the gas supply unit into the processing chamber to generate a second precursor of the film by having the first precursor of the film to react with the second gas, and configured to supply the second high frequency power to the substrate mounting table through the second wiring while maintaining the plasma in the processing chamber by the plasma generating unit to attract the plasma including the second precursor of the film to the semiconductor substrate, thereby adhering the second precursor of the film onto the semiconductor substrate.

9. The plasma processing apparatus of claim 8, wherein the power application and gas supply controller
is configured to supply the first gas from the gas supply unit into the processing chamber to generate the plasma of the first gas in the processing chamber by the plasma generating unit; and
is configured to supply the second high frequency power to the substrate mounting table through the second wiring to attract the plasma of the first gas to the semiconductor substrate to thereby etch the surface of the semiconductor substrate.

10. The plasma processing apparatus of claim 8, wherein the gas supply unit further supplies a third gas to react with the precursor of the film adhered onto the semiconductor substrate, the third gas being different from the second gas, and wherein the controller is configured to generate a plasma of the third gas supplied from the gas supply unit into the processing chamber by the plasma generating unit, and is configured to supply the second high frequency power to the substrate mounting table through the second wiring to attract the plasma of the third gas to the semiconductor substrate to process the precursor of the film adhered onto the semiconductor substrate by the plasma of the third gas.

11. The plasma processing apparatus of claim 10, wherein the third gas is a gas for reducing the precursor of the film.

12. The plasma processing apparatus of claim 8, further comprising a heater for heating the semiconductor substrate, wherein the controller is configured to heat the semiconductor substrate using the heater to process the precursor of the film adhered to the semiconductor substrate.

13. The plasma processing apparatus of claim 2, wherein the gas supply unit further supplies a third gas to react with the precursor of the film adhered onto the semiconductor substrate, and the third gas is different from the second gas.

14. The plasma processing apparatus of claim 13, wherein the third gas is a gas for reducing the precursor of the film.

15. The plasma processing apparatus of claim 1, further comprising a high frequency power supply,
wherein the first wiring and the second wiring are connected to the high frequency power supply through a switching device which connects the high frequency power supply to one of the first and the second wiring.

16. The plasma processing apparatus of claim 1, further comprising a first and a second high frequency power supply,
wherein the first wiring is connected to the first high frequency power supply and the second wiring is connected to the second high frequency power supply.

17. The plasma processing apparatus of claim 1, further comprising a power application controller,
wherein the power application controller
is configured to supply the first high frequency power to the metal member through the first wiring to attract the plasma to the metal member so as to etch the metal member by the plasma; and
is configured to supply the second high frequency power to the substrate mounting table through the second wiring to attract the plasma so as to adhere the precursor of the film onto the semiconductor substrate.

18. The plasma processing apparatus of claim 1, wherein the holder holds a plurality of metal members.

19. The plasma processing apparatus of claim 1, wherein the holder is a ring shaped member for holding the metal member on its inner peripheral wall surface.

20. The plasma processing apparatus of claim 19, wherein the metal member is a disc-shaped member, and a diameter of the metal member is less than a length of an outer peripheral wall surface of the holder.

21. The plasma processing apparatus of claim 1, wherein the metal member includes at least one selected from the group consisting of platinum, ruthenium, iridium, tantalum, germanium, tungsten, chromium, hafnium, nickel, cobalt, molybdenum and titanium.

22. The plasma processing apparatus of claim 1, wherein the gas including the halogen atoms is a hydrogen chloride gas, a chlorine gas, a fluoric gas, a fluorocarbon gas, or a hydrogen bromide gas.

23. The plasma processing apparatus of claim 1, further comprising a shutter mechanism for controlling the contact between the metal member and the plasma.

24. A plasma processing apparatus comprising:
a processing chamber including a cylindrical bell jar provided at an upper part of the processing chamber;
a plasma generating unit including a coil wound around an outer periphery of the bell jar and a grounded conductive member disposed on an outer side of an upper wall of the bell jar which generates a plasma of a gas supplied into the processing chamber;
a substrate mounting table, disposed in the processing chamber, which mounts a semiconductor substrate having a surface on which an etching and/or a film forming process is to be carried out;
a metal member disposed in the processing chamber and to be etched by the plasma generated in the processing chamber to thereby release a precursor of a film to be formed by the film forming process into the processing chamber;
a holder in the bell jar which detachably holds the metal member;
a gas supply unit which supplies a first and a second gas into the processing chamber, wherein the second gas includes halogen atoms and is different from the first gas;
a first wiring which supplies a first high frequency power to the metal member to attract the plasma generated in the processing chamber to the metal member; and
a second wiring which supplies a second high frequency power to the substrate mounting table to form an electric field between the substrate mounting table and the conductive member and to attract the plasma generated in the processing chamber to the semiconductor substrate; and
a third wiring which supplies a third high frequency power to the coil to form an induced electromagnetic field within the bell jar,
wherein the metal member and the holder are disposed in a plasma generating space in which the plasma is generated by the plasma generating unit, the plasma generating space is provided between an inner side of the upper wall of the bell jar and the substrate mounting table,
wherein the metal member and the holder are surrounded by the coil, and
wherein the metal member and the holder are disposed to be spaced apart from the substrate mounting table and from the upper wall of the bell jar.

* * * * *